United States Patent

Mar

[15] 3,650,020

[45] Mar. 21, 1972

[54] METHOD OF MONITORING SEMICONDUCTOR DEVICE FABRICATION

[72] Inventor: Jerry Mar, Summit, N.J.

[73] Assignee: Bell Telephone Laboratories, Incorporated, Murray Hill, Berkeley Heights, N.J.

[22] Filed: Feb. 24, 1970

[21] Appl. No.: 13,488

[52] U.S. Cl. ....29/574, 148/186

[51] Int. Cl. ....B01j 17/00, H01l 7/00

[58] Field of Search ....29/574, 593

[56] References Cited

UNITED STATES PATENTS

| | | | |
|---|---|---|---|
| 3,440,715 | 4/1969 | Sang | 29/574 |
| 3,465,427 | 9/1969 | Barson et al. | 29/574 |
| 3,513,536 | 5/1970 | Lambert | 29/574 |
| 3,518,545 | 6/1970 | Copeland | 29/574 X |

*Primary Examiner*—John F. Campbell
*Assistant Examiner*—W. Tupman
*Attorney*—R. J. Guenther and Arthur J. Torsiglieri

[57] ABSTRACT

A method is described for monitoring the extent of lateral and vertical diffusion of the emitter and base regions of transistor elements during the production of integrated circuits. A V-shaped mask pattern is utilized to form a V-shaped resistor in the semiconductor wafer of the circuit. Lateral diffusion will cause a small increase in leg width of the resistor relative to the original pattern, resulting in a shift in the position of the notch of the V-shaped resistor relative to the pattern which thereby results in a correspondingly large decrease in leg length, as measured from the base of the leg to the notch. Measurement of the resistance around the path of the resistor determines the change in leg length from which can be calculated the extent of lateral diffusion. The latter value can then be used to estimate junction depth. Following the teachings of this invention, the extent of oxide etching and photographic mask definition may also be monitored during the fabrication of the integrated circuit.

4 Claims, 7 Drawing Figures

INVENTOR
J. MAR
BY [signature]
ATTORNEY

METHOD OF MONITORING SEMICONDUCTOR DEVICE FABRICATION

BACKGROUND OF THE INVENTION

This invention relates to a method for monitoring the extent of lateral diffusion, junction depth, oxide etching and photographic mask definition in the production of solid state semiconductor devices. In particular, the invention is described in terms of integrated circuit production.

Integrated circuits are typically manufactured in batches on a single semiconductor wafer. The individual processing steps are well known in the art. In the usual method, very generally, an oxide layer is first formed on the surface of the semiconductor wafer and then covered by a photoengraving resist. A photographic mask, with opaque and transparent regions forming a pattern representing the particular circuit configuration desired, is laid upon the photo resist and exposed to light. The wafer is immersed in a chemical solution to remove the portions of the photo resist not exposed to light. The oxide which is thus exposed be removal of the photo resist is then etched away by known techniques leaving islands of photo resist-oxide layers interspersed with exposed portions of the semiconductor wafer corresponding to the original mask pattern. After chemically removing the photo resist material, the base regions of the transistors are diffused into the wafer regions exposed by the etching process thus forming discrete elements throughout the wafer. The process is then repeated to form the emitter regions of the transistor elements. By using this planar diffusion process, several hundred transistor circuits may be formed simultaneously on a single wafer an inch in diameter.

In order to insure a circuit with the proper specifications, it is necessary to monitor several steps in the fabrication process. It must first be determined whether the photographic mask represents an accurate reproduction of the original pattern designed. Often in reducing the designed pattern to the final mask, improper focusing, diffraction effects, or improper exposure will change the line widths on the final negative. It is also important to determine if the oxide has been properly etched so that the exposed region to be diffused has the same dimensions as the mask pattern. Since impurities diffuse laterally almost as much as they diffuse vertically, the extent of lateral diffusion must be monitored to maintain the proper spacing between the elements. Finally, the extent of vertical diffusion (junction depth) must be determined to insure devices with the proper current gain characteristics.

The most commonly used method of measuring the extent of lateral and vertical diffusion is "angle-lapping. This method involves chipping off a piece of the semiconductor crystal, lapping away at an angle, and staining the exposed cross section to contrast the p and n regions. This is a very tedious and time-consuming process. Furthermore, it necessitates the destruction of part of the crystal. Other methods devised for measuring junction depth by determining the sheet resistance of the base material (U.S. Pat. No. 3,465,427) and the current gain characteristics of test transistors (U.S. Pat. No. 3,440,715) have proved inaccurate.

SUMMARY OF THE INVENTION

Accordingly, it is a prime object of the present invention to provide an accurate, nondestructive method of monitoring the extent of lateral and vertical diffusion in the production of semiconductor devices.

It is a further object of the invention to provide a means for monitoring the extent of oxide etching in the production process.

It is a still further object of the invention to provide a quick means for ascertaining whether or not the photographic mask used in semiconductor device fabrication has been properly prepared.

These and other objects are achieved by providing a V-shaped test pattern on the photographic mask. To measure lateral diffusion, a V-shaped resistor is diffused into the semiconductor wafer simultaneously with the diffusion of the other regions of the integrated circuit. A small increase in the leg width of the diffused resistor relative to the pattern due to the lateral diffusion spread results in a shift of the position of the notch of the V-shaped resistor relative to the pattern. This produces a correspondingly large decrease in leg length measured from the base to the notch. This decrease in leg length can be determined by measuring the resistance around the path of the resistor and from the former value can be calculated the change in leg width, i.e., the extent of lateral diffusion. The amount of vertical diffusion can, in turn, be determined from the value of lateral diffusion.

Since a small change in leg width of the pattern produces a noticeable shift in the notch of the "V," the photographic mask definition can be monitored by a quick inspection of the pattern. Similarly, it can be determined whether the osice has been over-etched or under-etched by examining the position of the notch on the oxide window.

BRIEF DESCRIPTION OF THE DRAWING

These and other objects and features of the invention are delineated in the description to follow and in the drawings in which.

DETAILED DESCRIPTION OF THE INVENTION

As previously described, in the production of integrated circuits several circuits are produced simultaneously on the same semiconductor wafer by planar-diffusion methods. It is therefore possible to include on the wafer certain test structures which will permit measurement of the extent of lateral and vertical diffusion of all the elements on the wafer. These structures may be included on each chip of an integrated circuit or on special test chips.

Figure 1:
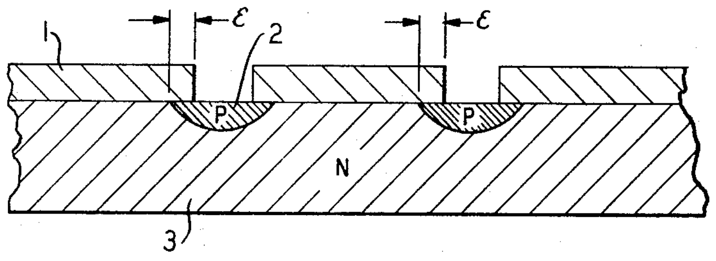
FIG. 1 is a cross sectional view of one embodiment of the invention for measuring lateral diffusion.

FIG. 1 shows a cross sectional view of a test structure according to the present invention. After the oxide coating, 1, has been etched away to form windows as shown, the P-type material, 2, is diffused into a wafer of n-type conductivity, 3, by known techniques. It should be noted that the n and p designations are for convenience only and the invention applies equally when a P-type wafer is used and an n-type material is diffused therein. Furthermore, it should be noted that for convenience FIG. 1 shows the result of one diffusion step. However, the invention is equally applicable to the second diffusion step in the production of double diffused transistors. As shown in the figure, the P-type material has spread beyond the windows formed by the oxide etch and the amount of lateral diffusion at one edge of the window is represented by $\epsilon$. It is this value which must be initially determined.

Figure 2:
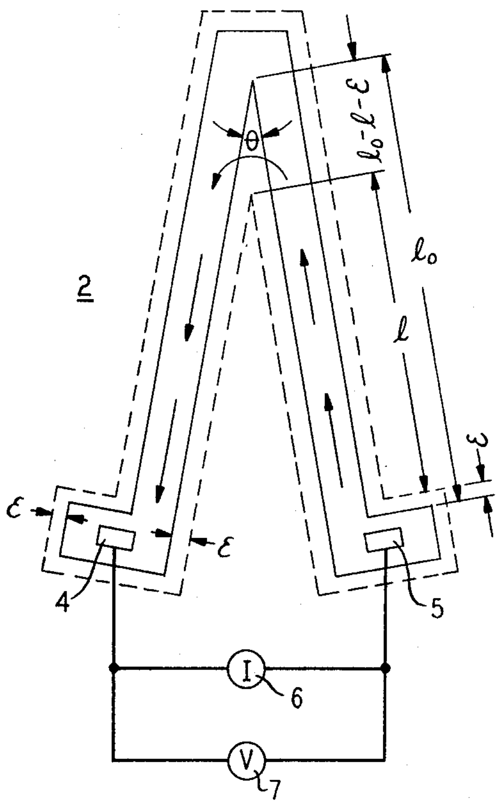
FIG. 2 is a top schematic view of the same embodiment of the invention for measuring lateral diffusion.
Figure 2A:
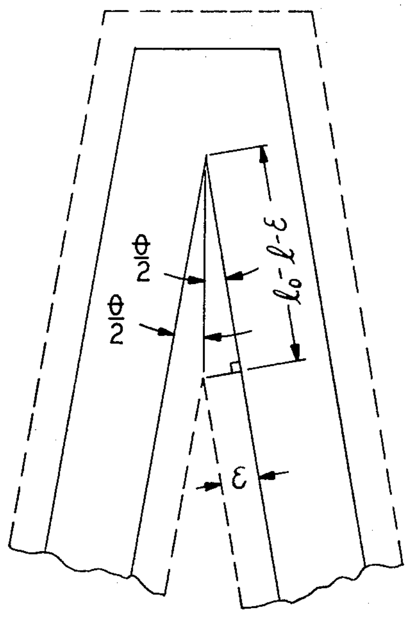
FIG. 2A is a magnification of a portion of FIG. 2.

FIG. 2 is a schematically drawn top view of the structure of FIG. 1 demonstrating the process for determining lateral diffusion. The solid lines indicate the dimensions of the pattern as defined by the oxide window and the dashed lines represent the dimensions of the diffused material, thus indicating the extent of lateral diffusion. If the angle between the legs of the V-pattern, $\theta$, is small, a small change in the leg width, $2\epsilon$, of the diffused material relative to the original pattern will produce a large decrease in the leg length of the resistor as shown. A magnification of the notch area shown in FIG. 2A indicates the geometry of the system. It can be seen that when lateral diffusion increases the leg width by 2$\epsilon$, the effective leg length of the diffused material, $l$, is smaller than the length of the original pattern, $l_0$, according to the relationship:

$$l = l_0 - (1+\cot \theta/2)\,\epsilon \quad (1)$$

This change in leg length can be determined by measuring the resistance around the path as indicated by the arrows in the figure. As shown, electrical contact is made to the diffused resistor at the base of the legs through platinum-silicide contacts 4 and 5. Current is provided by a constant current source, 6, and a high impedance voltmeter, 7, is connected in parallel therewith. The resistance, R, around the path is given by: $R = R_N + R_c + 2R_l\,[l_0 - (1+\cot \theta/2)\,\epsilon]$, (2) where $R_l$ is the resistance per unit length of a leg, $R_c$ is the contact resistance, and $R_N$ is the resistance around the bend above the notch. By using the well-known expression $R = V/I$, we can measure $R$, $R_l$, $R_c$ and $R_N$ and, knowing $l_0$ and $\theta$ from the original pattern, the lateral diffusion spread $\epsilon$ can be calculated. With this basic V— pattern, $R_N$ can be made negligible by making the legs very thin. The contact resistance $R_c$ can also be ignored if the contact areas are made large enough. $R_l$ can be measured by a separate test pattern of a simple strip of known length. $R$ is then determined by the process illustrated in FIG. 2 and $\epsilon$ is calculated.

Figures 3, 4:
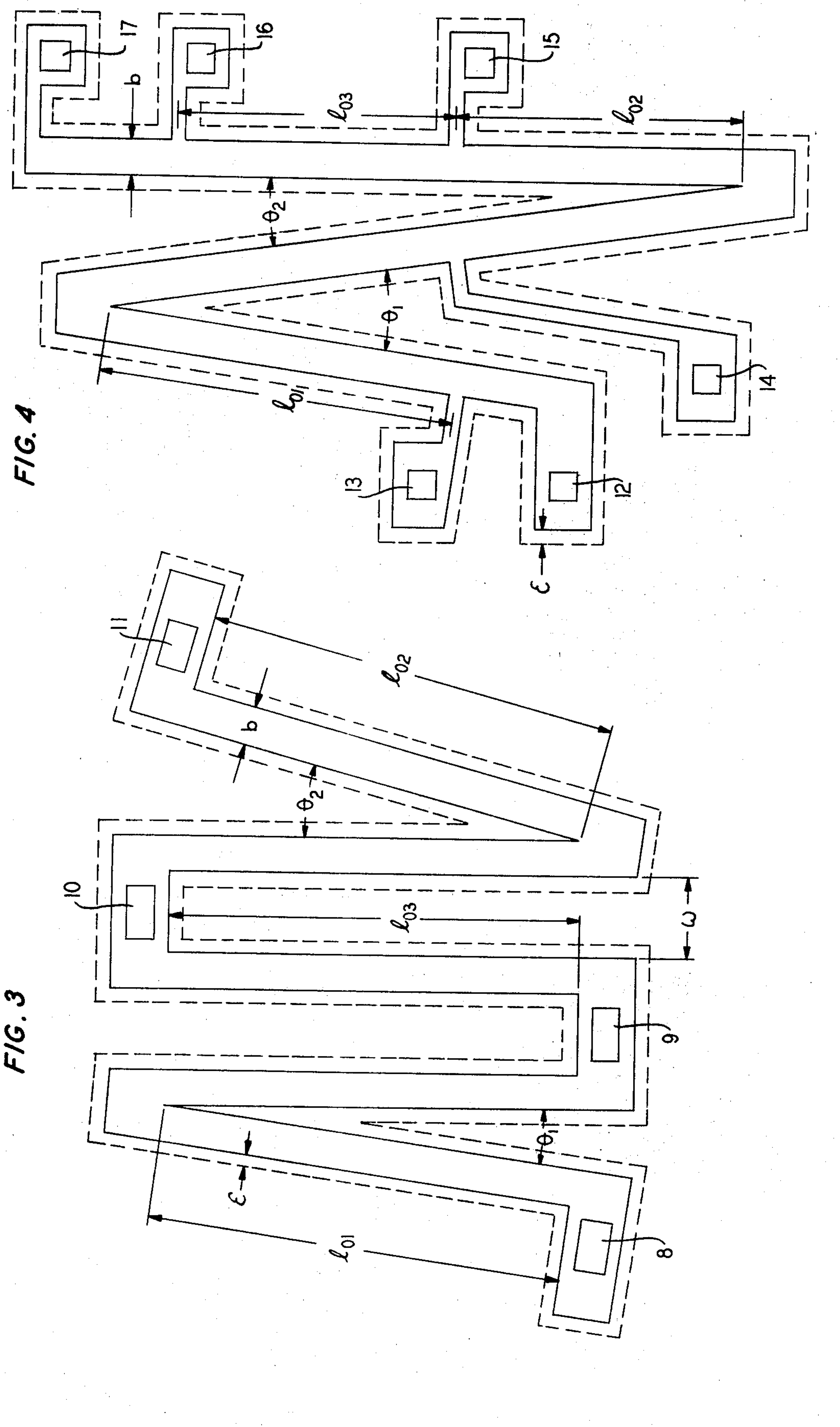
FIG. 3 is a top schematic view of another embodiment of the invention for measuring lateral diffusion.
FIG. 4 is a top schematic view of a further embodiment of the invention for measuring lateral diffusion.

In practice, the extent of lateral diffusion can be determined more accurately with variations on the basic V- pattern described above. FIGS. 3 and 4 illustrate exemplary embodiments.

FIG. 3 represents the use of a two—V pattern with four contact surfaces, 8, 9, 10 and 11. The constant current source (not shown) is connected at surfaces 8 and 11. Once again, the solid lines represent the original pattern as outlined by the oxide window and the dashed lines indicate the dimensions of the diffused resistor. By using a standard probe, high impedance voltmeter, the resistance between contacts 8 and 9 ($R_1$), 10 and 11 ($R_2$), and 9 and 11 ($R_3$) are measured ($R = V/I$). If the distance, $w$, between the base of one V and the notch of the other V is made much smaller than $l_0$ as shown in the figure, and it is assumed that the resistance around the notch of each V is equal and that all the contact resistances are equal, the geometry of the configuration gives:

$$R_1 = R_c + R_N + 2R_l\left[l_{0_1} - \left(1 + \cot\frac{\theta_1}{2}\right)\epsilon\right], \quad (3)$$

$$R_2 = R_c + R_N + 2R_l\left[l_{0_2} - \left(1 + \cot\frac{\theta_2}{2}\right)\epsilon\right], \quad (4)$$

$$R_3 = R_l(l_{0_3} - 2\epsilon) + R_2, \quad (5)$$

where $l_{0_1}$, $l_{0_2}$ and $l_{0_3}$ are the lengths on the original pattern as shown in FIG. 3, $\theta_1$ and $\theta_2$ are the angles between the legs, $R_l$ is the resistance per unit length of the legs, $R_c/2$ is the contact resistance of any contact, $R_N$ is the notch resistance and $\epsilon$ is the extent of lateral diffusion at one edge of the oxide window. In these equations there are three unknowns: $R_c + R_N$, $R_l$ and $\epsilon$. Solving for $\epsilon$, it is found:

$$\epsilon = \frac{(R_3 - R_2)(l_{0_1} - l_{0_2}) - (R_1 - R_2)\frac{l_{0_3}}{2}}{(R_3 - R_2)\left(\cot\frac{\theta_1}{2} - \cot\frac{\theta_2}{2}\right) - (R_1 - R_2)}. \quad (6)$$

Thus it is possible to calculate the extent of lateral diffusion with a two—V, four contact pattern by measuring the resistance around three segments of the diffused resistor and measuring the leg lengths and leg angles of the mask pattern.

Even greater accuracy can be obtained from the embodiment pictured in FIG. 4 which represents the use of a two—V pattern with six contact areas. This operates in the same way as the four contact pattern except that the contact resistances do not enter the calculations at all. Here the current is passed from contact 12 to contact 17 and the resistance between contacts 13 and 14 ($R_1$), 14 and 15 ($R_2$), and 15 and 16 ($R_3$) are measured using a high impedance voltmeter to determine the potential drop along those segments of the resistor. Making the single assumption that the resistance around each notch is equal, the equations representing the system are:

$$R_1 = R_N \quad 2R_l\left(l_{0_1} - \cot\frac{\theta_1}{2}\epsilon\right), \quad (7)$$

$$R_2 = R_N + 2R_l\left(l_{0_2} - \cot\frac{\theta_2}{2}\epsilon\right), \quad (8)$$

$$R_3 = R_l l_{0_3}, \quad (9)$$

where $l_{0_1}$, $l_{0_2}$ and $l_{0_3}$ are the leg lengths as shown in the figure, $\theta_1$ and $\theta_2$ are the angles between the legs as shown, $R_N$ is the resistance around the notch, $R_l$ is the resistance per unit length of the legs and $\epsilon$ is the extent of lateral diffusion at one edge of the oxide window. Solving for $\epsilon$ gives:

$$\epsilon = \frac{1}{\cot\frac{\theta_1}{2} - \cot\frac{\theta_2}{2}}\left[l_{0_1} - l_{0_2} - \left(\frac{R_1 - R_2}{2R_3}\right)l_{0_3}\right]. \quad (10)$$

Once again the extent of lateral diffusion can be calculated from a measurement of the resistance along three segments of the diffused resistor and from measuring the leg lengths and angles of the original pattern.

It should be clear that a great many modifications of the V-pattern discussed are within the teachings of the present invention. Various configurations may be used as patterns to meet special needs by varying the position and number of the contacts, the angle between the legs and the number and position of "V's." One further embodiment is especially significant.

It is desirable in the production of integrated circuits to separate the collector regions of each transistor element rather than have one common region for all devices on the wafer. The most widely used method of accomplishing this separation is "isolation diffusion " wherein, for example, an n-type film serving as the collector region, is grown epitaxially on a P-type substrate and a P-type material is then diffused through the film to the substrate forming isolated regions of n-type material. The usual diffusion steps for the production of the transistor elements are then performed within these regions. The extent of lateral diffusion becomes critical since if the P-type isolation material is diffused too far laterally, the transistor elements will be shorted out. Use of the basic method of this application to determine lateral diffusion will fail since current will flow in the P-type substrate as well as the P-type isolating region and so an accurate measurement of resistance is not possible. A slight modification is the process in therefore used.

Figure 5:
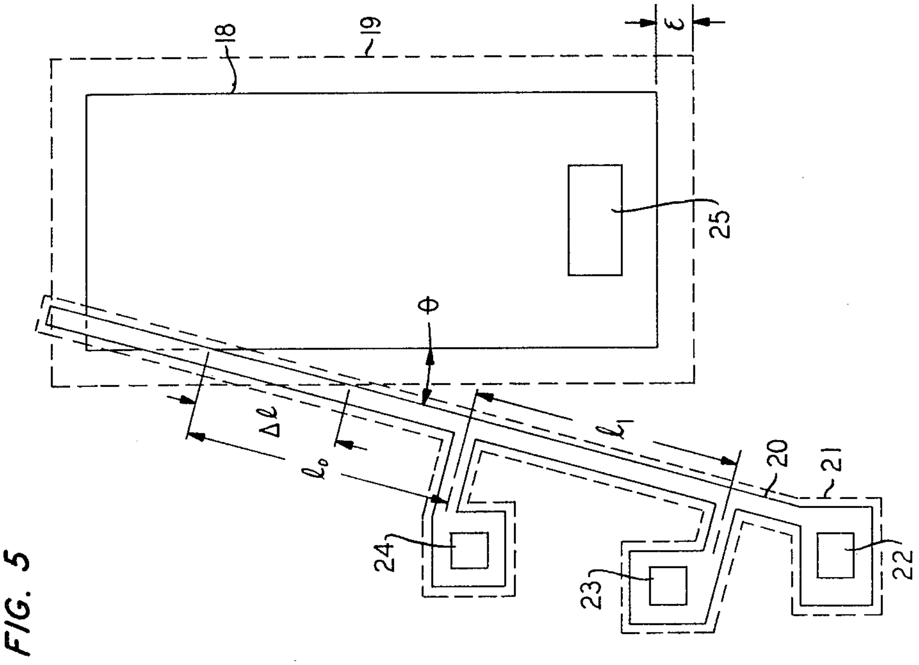
FIG. 5 is a top schematic view of a further embodiment of the invention for measuring lateral diffusion in an isolated diffusion process.

FIG. 5 is a top schematic view of this embodiment of the invention. The process differs from that described above, first of all in the fact that the two "legs" of the V-shaped test resistor are formed during different diffusion steps. The first leg is formed during the isolation diffusion by a rectangular-shaped pattern outlined by the oxide window 18. The boundary of the diffused isolating region is represented by the dashed lines 19, demonstrating the extent of lateral diffusion of the P-type isolating material, $\epsilon$. It should be noted that the use of the rectangular shape is illustrative only and other patterns may be used as long as they have one straight edge.

A contact layer, 25, is formed as shown. It should be noted that the position of this contact is not critical, and could be formed on the diffused region vertically as well as horizontally. The area should be large, however, to reduce contact resistance.

The second leg is formed during the base diffusion process in the production of the transistor element by means of a thin rodlike pattern set at a known angle to the isolating leg pattern, $\theta$. The outline of this second pattern is illustrated by the oxide window 20 and the actual boundary of the diffused "-base resistor" is illustrated by dashed lines 21. Suitable contact areas are included in the pattern and contact layers 22, 23 and 24 are formed on the resistor. The basic principle of this method is the same as that utilizing the other patterns described above except that here only the resistance of one leg is considered in the calculation. Since the isolating region is so highly doped, the resistance of the "isolating" leg (typically 5 Ω per square) is small compared to the resistance of the "-base" leg (typically 200 Ω per square). Here, also, the lateral diffusion of the "base" leg is small as compared to the lateral diffusion of the "isolating" leg and can be ignored in the calculations. Thus, after the diffused resistor is formed, current is passed from contact 22 to contact 25. A resistance measurement, $R_1$, is made by contacting areas 23 and 24 which define a segment of length $l_1$, as shown. The total resistance around the path from 24 to 25, $R$, is also measured. Since the resistance of the "isolating" leg is small, the resistance $R$ can be thought of as the resistance of the "base" leg segment of the resistor from contact 24 to the intersection of the legs. Hence, $$R \cong R_l(l_0 - \Delta l), \qquad (11)$$

where $R_l$ is the resistance per unit length at the "base" leg, $l_0$ is the length of the "base" leg segment on the original pattern and $\Delta l$ is the change in leg length caused by the effect of lateral diffusion of the "isolating" leg. The geometry of the system gives:

$$R \cong R_1/l_1\ (l_0 - \epsilon \csc\theta). \qquad (12)$$

Therefore the extent of lateral diffusion is calculated from the expression: $\epsilon \cong (l_0 - l_1 R/R_1)\sin\theta$. (13)

Again, from a knowledge of length and angle on the original pattern and resistance measurements along certain segments of the diffused resistor, the extent of lateral diffusion can be calculated. Although the process is described for the case of transistor fabrication, tion, it should be obvious that it can be used in any semiconductor element production utilizing an isolation diffusion process.

A determination of the extent of vertical diffusion follows easily from these measurements of lateral diffusion. The most accurate method would be to simply determine experimentally the relationship between lateral and vertical diffusion for a given material diffused into a given background. The extent of vertical diffusion could then be read off the curve using the measurement of lateral diffusion obtained by the present invention. An estimate of vertical junction depth can also be made based on prior art approximation methods. For example, Kennedy and O'Brien, "Analysis of the Impurity Atom Distribution Near the Diffusion Mask for a Planar P-N Junction, " *IBM Journal of Research and Development*, Vol. 9, p. 179 (1965) gives a calculation of lateral versus vertical diffusion for the case of diffusions into uniformly doped silicon. These calculations indicate that lateral diffusion spread is approximately 20 percent smaller than vertical diffusion depth for a typical P-type base diffusion into N-type silicon. For the case of N-type emitter diffusion into a P-type base, the calculations show that lateral spread is approximately 18 percent smaller than vertical depth assuming a uniformly doped background. The latter assumption is not correct, however, and further calculations indicate that when nonuniformity is taken into account, the lateral spread for the emitter diffusion will also be approximately 20 percent smaller than vertical diffusion depth.

Several other features of the present invention should be noted. If the basic V— pattern is included on the photographic mask, there is established a means of checking whether improper focusing, improper reduction or diffraction effects have changed the line widths of the pattern as originally drawn. Since a small change in leg width will produce a large change in the position of the notch of the "V" provided the angle between the legs is small, a quick optical inspection of the pattern will determine whether and to what extent the line widths have changed. It should be noticed that the patterns shown in FIGS. 3 and 4 can also be used for this purpose if attention is focused on either one of the "V's" in the pattern.

Figure 6:
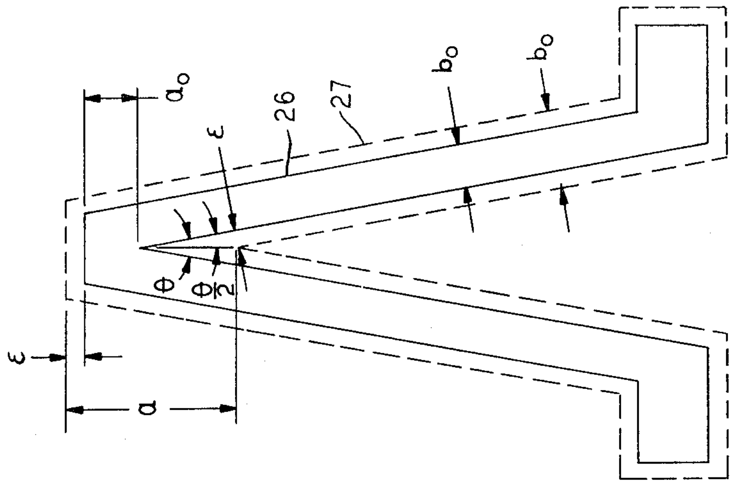
FIG. 6 is a top schematic view of one embodiment of the invention for measuring photographic mask definition and the extent of oxide etching.

FIG. 6 is a schematic view of a basic V- pattern used for determining photographic definition. The solid line, 26, indicates the pattern as it should appear on the final mask and the dashed line 27 indicates the extent to which the line widths have changed due to improper photographic definition. If $a_0$ is the distance of the notch from the top line of the "V," the "-notch distance," as it should appear, $b_0$ is the proper width of the legs, $a$ and $b$ are the corresponding dimensions on the actual mask pattern and $\theta$ is the angle between the legs, it can be seen that:

$$\sin\frac{\theta}{2} = \frac{\epsilon}{a - a_0 - \epsilon}, \qquad (14)$$

or $$\epsilon = \frac{(a - a_0)\sin\frac{\theta}{2}}{1 + \sin\frac{\theta}{2}}. \qquad (15)$$

Dividing both sides of the equation by $b_0$ and assuming the change in line width is small ($b_0 \cong b$) and $b < a$, it can be shown that:

$$\Delta b = 2b_0\left(\frac{a}{b} - \frac{a_0}{b_0}\right)\left(\frac{\sin\frac{\theta}{2}}{1 + \sin\frac{\theta}{2}}\right). \qquad (16)$$

Thus, by a quick measurement of $a/b$ on the mask, the extent of line width change, $\Delta b$, can be determined. It should be noted that improper mask definition may also result in a narrowing of line widths and the method described here is equally applicable thereto.

In much the same manner, the extent of oxide etching may also be monitored. Insufficient etching will reduce, while over-etching will increase, the dimensions of the exposed semiconductor regions relative to the mask pattern. Thus, FIG. 6 may be thought of as representing a means of determining the extent of over-etch if the solid lines, 26, represent the mask pattern and the dashed lines 27 represent the area exposed by the etching. The equation for determining the amount of over-etch is then identical to the equation (16). Of course, the same expression could be used to determine the amount of under-etch. It should be noted that it is not necessary to measure $a/b$ immediately after oxide etching since the image of the window will remain after subsequent oxidation, etching and diffusion steps.

Various additional modifications and extensions of this invention will become apparent to those skilled in the art. All such variations and deviations which basically rely on the teachings through which this invention has advanced the art are properly considered within the spirit and scope of this invention.

What I claim is:

1. The method of measuring the extent of lateral and vertical diffusion of a material of one conductivity type diffused into a material of second conductivity type by measuring the extent of lateral and vertical diffusion of certain test regions produced concurrently in the same process comprising the steps of:

diffusing a test region of one conductivity type into a material of second conductivity type by means of a mask comprising a V-shaped pattern of preselected leg width, leg length and angle between the legs, including suitable areas for forming electrical contact regions on the diffused region;

applying electrical contacts to said areas on the diffused region;

applying a voltage across the surface of said diffused region; and measuring the resistance along segments of the surface of said diffused region to determine the extent of lateral and vertical diffusion of the said diffused region.

2. The method of claim 1 wherein the V-shaped pattern comprises two V shapes disposed in opposite directions connected by a strip and includes four contact areas.

3. The method of claim 1 wherein the V-shaped pattern comprises two connected V shapes disposed in opposite directions and includes six contact areas.

4. In an isolation diffusion process, the method of measuring the extent of lateral diffusion of an isolating region of material of a first conductivity type diffused into and through a material of second conductivity type by measuring the extent of lateral diffusion of certain diffused test regions produced concurrently in the same process comprising the steps of:

diffusing an isolating region of a first conductivity type into and through a material of a second conductivity type by means of a pattern with one straight edge;

diffusing a second region of first conductivity type partly into the material of second conductivity type and partly into said isolating region by means of a thin, rod-shaped pattern of preselected length with suitable contact areas such that the said second region forms a preselected angle with the straight edge of the isolating region, said second region having a resistance per unit length at least ten times greater than said isolating region;

contacting said isolating region and said second region at suitable areas;

applying a voltage across the surface of said diffused regions; and measuring the resistance along segments of the surface of said diffused regions to determine the extent of lateral diffusion of said isolating region.

* * * * *

UNITED STATES PATENT OFFICE

CERTIFICATE OF CORRECTION

Patent No. 3,650,020 Dated March 21, 1972

Inventor(s) Jerry Mar

It is certified that error appears in the above-identified patent and that said Letters Patent are hereby corrected as shown below:

Column 1, line 21, after "exposed", change "be" to --by--.

Column 2, line 17, change "osice" to --oxide--.

Column 3, line 40, after "than", change "$\ell_0$" to --$\ell_{0_3}$--.

Column 4, line 5, equation 7 should read:

$$R_1 = R_N + 2R_\ell \left( \ell_{0_1} - \cot \frac{\theta_1}{2} \varepsilon \right), \qquad (7)$$

Column 4, line 49, after "modification" change "is" to --in--, after "process" change "in" to --is--.

Column 5, line 31, after "fabrication," delete "tion,".

Signed and sealed this 25th day of July 1972.

(SEAL)
Attest:

EDWARD M.FLETCHER,JR.
Attesting Officer

ROBERT GOTTSCHALK
Commissioner of Patents